(12) United States Patent
Kim

(10) Patent No.: US 6,563,756 B2
(45) Date of Patent: May 13, 2003

(54) MEMORY DEVICE WITH REDUCED REFRESH NOISE

(75) Inventor: Gyu Hong Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/993,770

(22) Filed: Nov. 27, 2001

(65) Prior Publication Data

US 2002/0071327 A1 Jun. 13, 2002

(30) Foreign Application Priority Data

Dec. 13, 2000  (KR) ........................................ 2000-75941

(51) Int. Cl.⁷ ................................................ G11C 7/00
(52) U.S. Cl. ............. 365/222; 365/230.03; 365/230.06; 365/194
(58) Field of Search ............................ 365/222, 230.03, 365/194, 230.06, 230.09

(56) References Cited

U.S. PATENT DOCUMENTS 5,644,545 A  *  7/1997  Fisch ........................ 365/222

\* cited by examiner

*Primary Examiner*—David Lam

(57) ABSTRACT

A memory device capable of reducing refresh noise generated in refreshing a plurality of memory cell blocks at the same time is provided. The memory device includes a plurality of memory cell blocks, a block select unit, and a row decoder. Each of memory cell blocks includes a plurality of sub-memory cell array blocks, and the block select unit outputs a plurality of block select signals corresponding to a plurality of control signals generated by a block select address. The row decoder selects at least one memory cell block corresponding to at least one block select signal activated among the plurality of the block select signals and activates a word line of a memory cell block selected by responding to a row address.

6 Claims, 3 Drawing Sheets

MEMORY DEVICE WITH REDUCED REFRESH NOISE

CROSS-REFERENCES TO RELATED APPLICATIONS

This application relies for priority upon Korean Patent Application No. 2000-75491, filed on Dec. 13, 2000, the entire contents of which are hereby incorporated herein by reference in their entirety as if fully set forth herein.

BACKGROUND OF THE INVENTION

1. Field of the Invention

The present invention relates to a memory device, and more particularly, to a control of refreshing a DRAM.

2. Description of the Related Art

A general dynamic RAM (DRAM) requires a data refreshing process to preserve data stored in a cell.

Refresh is performed to restore the charge on a memory cell capacitor before leakage of charge reaches a predetermined level, because charge in the memory cell capacitor leaks along a semiconductor surface. Refresh is performed either by a certain instruction generated in a system (CAS before RAS refresh), or automatically under certain conditions (auto refresh). The refreshing process repeats the sensing of lost cell data and restores the lost cell data to its prior state through a sense amplifier. In general, refresh intervals are determined by the capacitance of a memory cell capacitor and size of a MOS transistor used in the memory cell.

As the integration density of memories increases, the number of refresh cycles increases with the number of memory rows to be refreshed. As a result, refresh time also increases. However, since in a system using a memory, required refresh time is reduced rather than increased, a method of relatively reducing refresh intervals has been used to make up for an increase in the number of refresh cycles increasing with the integration of memories.

One such method involves refreshing not one but several sub-memory cell array blocks at the same time for a refresh period. However, as the number of sub-memory cell array blocks refreshed at the same time increases, peak current and momentary power consumption increase, thereby increasing a peak level. Therefore, circuit design and power supply voltage metal routing in consideration of this point become difficult.

SUMMARY OF THE INVENTION

To solve the above problems, it is an object of the present invention to provide a memory device for reducing noise power levels generated in refreshing a plurality of sub-memory cell array blocks at the same time.

Accordingly, to achieve the above object, there is provided a memory device including a plurality of memory cell blocks, a block select unit, and a row decoder.

Each of the memory cell blocks includes a plurality of sub-memory cell array blocks, and the block select unit outputs a plurality of block select signals corresponding to a plurality of control signals generated by a block select address. The row decoder selects at least one memory cell block corresponding to at least one block select signal activated among the plurality of block select signals and activates a word line of the selected memory cell block by responding to a row address. In a refresh mode, the block select unit selects N (a natural number) memory cell blocks among the plurality of the memory cell blocks and controls the row decoder to sequentially select N memory cell blocks after a predetermined delay.

The block select unit includes a non-delay type select circuit group for outputting a block select signal corresponding to a first control signal among the plurality of control signals, and an N–M (N minus M) delay type select circuit group for outputting a block select signal corresponding to a second control signal among the plurality of control signals and a signal activated in a refresh mode. Here, M is a natural number less than N.

The non-delay type select circuit group directly outputs a block select signal corresponding to the first control signal in a normal mode or a refresh mode, and the delay type select circuit group directly outputs a block select signal corresponding to the second control signal in a normal mode, and outputs a block select signal after a predetermined delay corresponding to the second control signal and a signal activated in the refresh mode.

The non-delay type select circuit group includes a plurality of non-delay type select circuits, and the delay type select circuit group includes N–M delay type select circuits each having different delay times.

The non-delay type select circuit includes a NAND gate, to one input of which a power supply voltage is applied, and to the other input of which one of the plurality of control signals is applied, and an inverter for inverting a signal output from the NAND gate. The delay type select circuit includes a delay unit for delaying the one control signal for a predetermined time, an inverter for inverting a signal activated in the refresh mode, a first NAND gate for responding to a signal activated in the refresh mode and an output signal of the delay unit, a second NAND gate for responding to the one of the plurality of control signals and an output signal of the inverter, and a third NAND gate for responding to output signals of the first and second NAND gates.

BRIEF DESCRIPTION OF THE DRAWINGS

The above objective and advantages of the present invention will become more apparent by describing in detail a preferred embodiment thereof with reference to the attached drawings in which.

DESCRIPTION OF A PREFERRED EMBODIMENT

Figure 1:
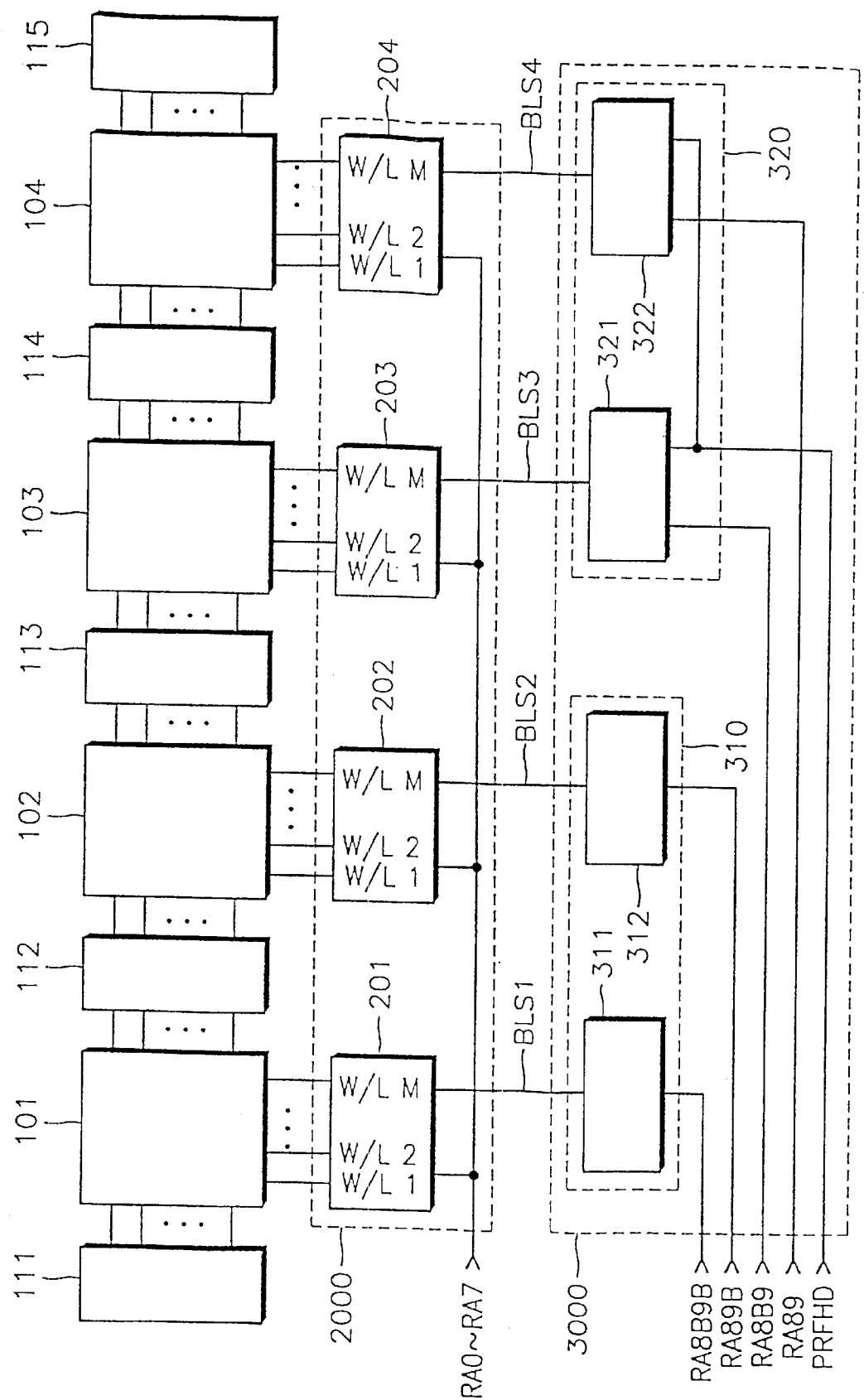
FIG. 1 is a block diagram of a memory device according to an embodiment of the present invention.

Hereinafter, a preferred embodiment of the present invention will be described in detail with reference to the attached drawings. Like reference numerals in the drawings denote the same members.

Referring to FIG. 1, a preferred embodiment of a memory device according to the present invention comprises memory cell blocks 101 to 104, sense amplifiers 111 to 115, a row decoder 2000, and a block select unit 3000.

The memory cell blocks 101 to 104 each include a plurality of sub-memory cell array blocks, and the sense amplifiers 111 to 115 output data to and receive data from the memory cell blocks 101 to 104.

The row decoder 2000 comprises four row address decoder blocks 201 through 204 and responds to four output signals BLS1 through BLS 4 of the block select unit 3000, respectively. At least one row address decoder block, which receives a signal activated among four output signals BLS 1 through BLS 4 of the block select unit 3000, activates word lines W/L1 to W/LM (M is a natural number.) of a memory cell block selected by responding to 8-bit row addresses RA0 to RA7.

The block select unit 3000 comprises a non-delay type select circuit group 310 and a delay type select circuit group 320. The non-delay type select circuit group 310 comprises a non-delay type select circuit 311 responding to one control signal RA8B9B among four control signals RA8B9B, RA89B, RA8B9, and RA89 generated from 2 bit block select addresses, namely, RA8 and RA9 of a row address (not shown), and a non-delay type select circuit 312 responding to another control signal RA89B. The delay select circuit group 320 comprises a delay type select circuit 321 responding to one control signal RA8B9 and a signal PRFHD activated in a refresh mode, and a delay type select circuit 322 responding to another control signal RA89 and the signal PRFHD.

Figure 2:
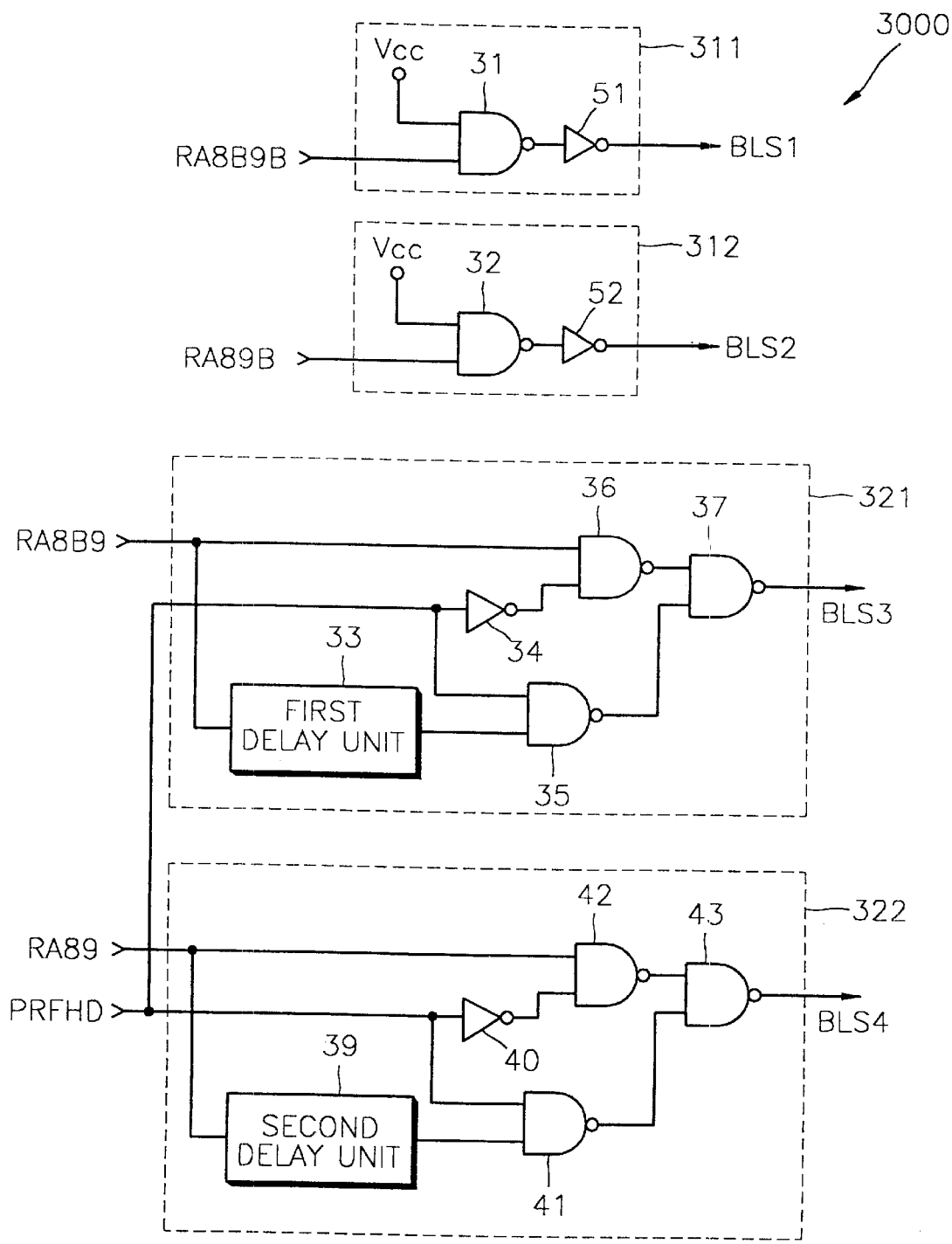
FIG. 2 is a circuit diagram of an embodiment of the block select unit illustrated in FIG. 1.

With reference to FIG. 2, in one embodiment, one non-delay type select circuit 311 comprises a NAND gate 31 and an inverter 51. A power supply voltage is applied to one input of the NAND gate 31, and a control signal RA8B9B is applied to the other input of the NAND gate 31. The inverter 51 outputs a signal BLS1 by inverting the output of the NAND gate 31. The other non-delay type select circuit 312 comprises a NAND gate 32 and an inverter 52. A power supply voltage is applied to one input of the NAND gate 32, and a control signal RA89B is applied to the other input of the NAND gate 32. The inverter 52 outputs a signal BLS2 by inverting the output of the NAND gate 32.

Also, as shown in the embodiment of FIG. 2, one delay type select circuit 321 comprises a first delay unit 33, a first inverter 34, a first NAND gate 35, a second NAND gate 36, and a third NAND gate 37. The first delay unit 33 delays one control signal RA8B9, and the first inverter 34 inverts a signal PRFHD. The first NAND gate 35 responds to a signal PRFHD and an output signal of the delay unit 33, and the second NAND gate 36 responds to a control signal RA8B9 and an output signal of the first inverter 34. The third NAND gate 37 responds to output signals of the first and second NAND gates 35 and 36, and outputs a signal BLS3.

The other delay type select circuit 322 comprises a second delay unit 39, a first inverter 40, a first NAND gate 41, a second NAND gate 42, and a third NAND gate 43. The second delay unit 39 delays one control signal RA89, and the first inverter 40 inverts a signal PRFHD. The first NAND gate 41 responds to a signal PRFHD and an output signal of the delay unit 39, and the second NAND gate 42 responds to a control signal RA89 and an output signal of the first inverter 40. The third NAND gate 43 responds to output signals of the first and second NAND gates 41 and 42 and outputs a signal BLS4.

Control signals RA8B9B, RA89B, RA8B9, and RA89 illustrated in FIG. 1 are generated using two upper bits, RA8 and RA9, of a row address (not shown) including information on block selecting.

In a normal mode, only one of the control signals RA8B9B, RA89B, RA8B9, and RA89 is activated, and the others are deactivated. Therefore, only one among the block select signals BLS1 to BLS4 of the block select unit 3000, operating in response to the control signals, is activated to thereby select one memory cell block.

In a refresh mode, one pair of control signals RA8B9B and RA8B9, or RA89B and RA89, among the control signals RA8B9B, RA89B, RA8B9, and RA89 are activated. Therefore, one pair of the block signals BLS1 and BLS3, of BLS2 and BLS4, among the block select signals BLS1 to BLS4 of the block select unit 3000, operating in response to the control signals, are activated to thereby select two memory cell blocks.

Figure 3:
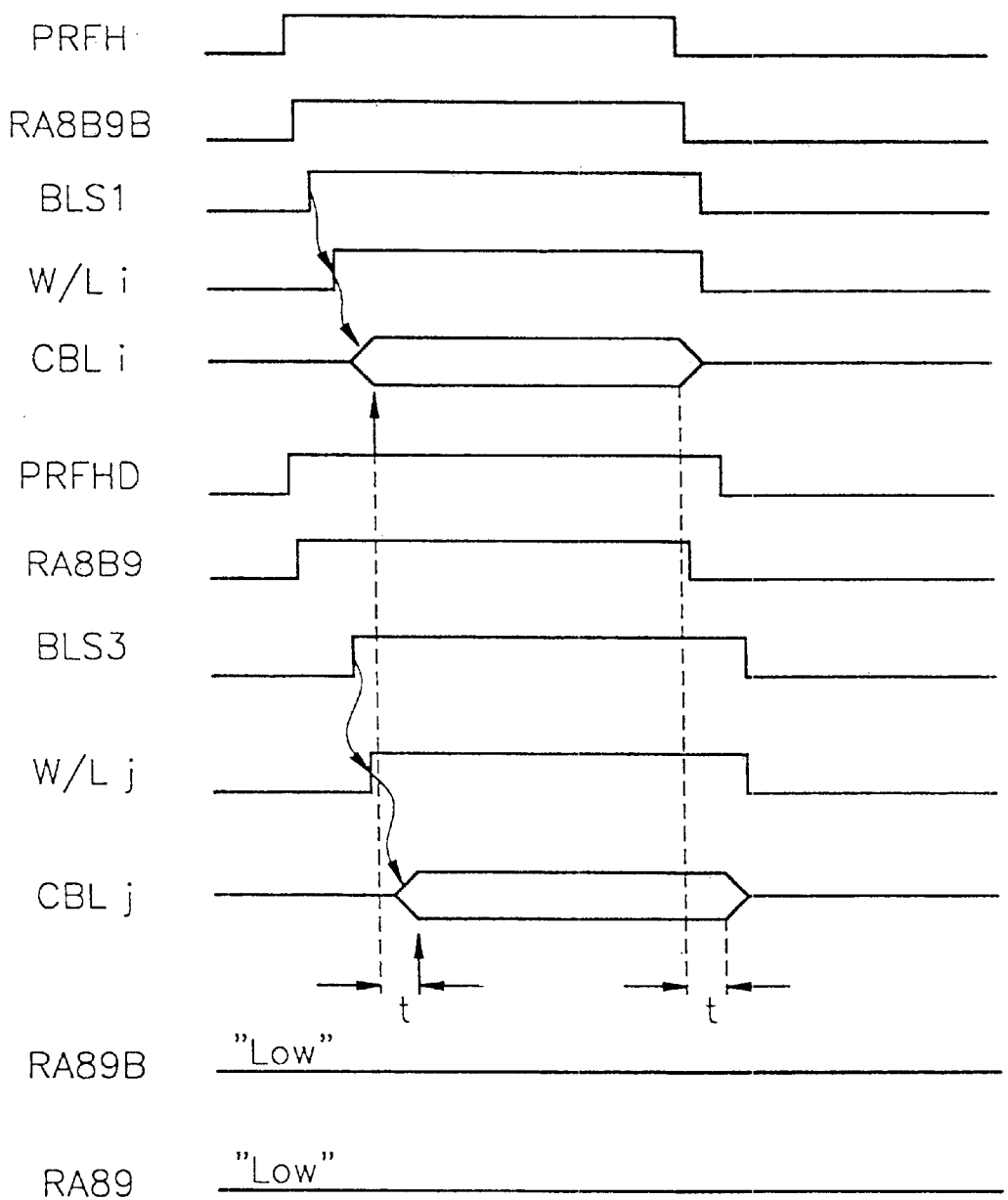
FIG. 3 is a waveform diagram in a refresh mode in a memory device according to an embodiment of the present invention.

Referring to FIG. 3, the output signal BLS1 of the block select circuit 301 is activated, and then the output signal BLS3 of the block select circuit 303 is activated after a predetermined delay corresponding to the delay time of the delay units 33 and 39 illustrated in FIG. 2. Herein, the waveform PRFH is a refresh instruction signal, the waveform PRFHD is the refresh instruction signal PRFH after having been delayed by a predetermined time, and waveforms CBL i and CBL j are output to communicate that row word lines W/L i and W/L j, which are selected based on the output signals BLS1 and BLS3 of the block select circuits 311 and 312, are respectively refreshed.

In this case, M is 2 and N is 1. Therefore, in a memory device according to an embodiment of the present invention, refreshes of two memory cell blocks begin (an upward row) at different times having a predetermined time difference of one refresh instruction signal.

Refresh begins when current supplied from a power source is at a maximum in performing refresh. Therefore, in a memory device according to an embodiment of the present invention, refresh is performed by dispersing refresh starting times of a plurality of memory cell blocks. The refreshing method of the present invention can reduce noise power levels and design overhead even in power routing.

In the present invention, a refresh mode using four memory cell blocks and 2 bit addresses is given as an example. However, the number of memory cell blocks and bit addresses may be further extended. In this case, the extension is made easier by properly adjusting the delay of a delay unit of a delay type select circuit.

As described above, when a plurality of memory cell blocks are refreshed, the respective refresh starting moments of the memory cell blocks are sequentially delayed for a predetermined time and then dispersed. As a result, noise power peak levels and design overhead can be reduced.

A preferred embodiment of the present invention has been described with reference to drawings. However it will be apparent to one of ordinary skill in the art that modifications to the described embodiment may be made without departing from the spirit and scope of the invention. Consequently, the scope of the present invention should be determined by the appended claims

What is claimed is:

1. A memory device, comprising:
   a plurality of memory cell blocks;
   a block select unit for outputting a plurality of block select signals corresponding to a plurality of control signals generated by a block select address; and
   a row decoder for selecting at least one memory cell block corresponding to at least one activated block select signal among the plurality of the block select signals and for activating a word line of selected the memory cell block, according to a row address,
   wherein in a refresh mode, the block select unit selects N memory cell blocks among the plurality of the memory cell blocks and controls the row decoder to sequentially select N memory cell blocks after a predetermined delay, where N is a natural number.

2. The memory device of claim 1, wherein the block select unit selects only one of the plurality of the memory cell blocks at a time in a normal mode.

3. The memory device of claim 2, wherein the block select unit comprises:

a non-delay type select circuit group for outputting a block select signal corresponding to a first control signal among the plurality of control signals; and an N–M (N minus M) delay type select circuit group comprising N–M select circuits, respectively, for outputting a block select signal corresponding to a second control signal among the plurality of control signals, where M is a natural number less than N, wherein the non-delay type select circuit group directly outputs a block select signal corresponding to the first control signal in a normal mode or a refresh mode; and wherein, in the normal mode, the delay type select circuit group directly outputs a block select signal corresponding to the second control signal and in the refresh mode outputs a block select signal after a predetermined delay corresponding to the second control signal and a signal activated in the refresh mode.

4. The memory device of claim 3, wherein the non-delay type select circuit group includes a plurality of non-delay type select circuits, and each of the N–M delay type select circuit group includes one delay type select circuits each having same delay times.

5. The memory device of claim 4, wherein the non-delay type select circuit comprises:

a NAND gate, to one input of which a power supply voltage is applied, and to an other input of which the second control signal is applied; and an inverter for inverting a signal output from the NAND gate.

6. The memory device claim 4, wherein the delay type select circuit comprises:

a delay unit for delaying the second control signal for a predetermined time;

an inverter for inverting the signal activated in the refresh mode;

a first NAND gate for responding to the signal activated in the refresh mode and an output signal of the delay unit;

a second NAND gate for responding to the second control signal and an output signal of the inverter; and a third NAND gate for responding to output signals of the first and second NAND gates.

* * * * *